(12) United States Patent
Sasada et al.

(10) Patent No.: US 6,987,294 B2
(45) Date of Patent: Jan. 17, 2006

(54) CHARGE-COUPLED DEVICE AND METHOD OF FABRICATING THE SAME

(75) Inventors: Kazuhiro Sasada, Hashima (JP); Mitsuru Okigawa, Nagoya (JP); Makoto Izumi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/386,706

(22) Filed: Mar. 13, 2003

(65) Prior Publication Data

US 2003/0178651 A1 Sep. 25, 2003

(30) Foreign Application Priority Data

Mar. 22, 2002 (JP) .............................. 2002-080027
Feb. 24, 2003 (JP) .............................. 2002-046052

(51) Int. Cl.
*H01L 29/768* (2006.01)
(52) U.S. Cl. .................... 257/249; 257/246; 257/247; 257/248; 257/250; 438/587; 438/588
(58) Field of Classification Search ................ 257/231, 257/233, 246, 247, 249, 250, 245, 248, 292, 257/411; 438/60, 75, 78, 79, 587, 588
See application file for complete search history.

(56) References Cited

U.S. PATENT DOCUMENTS

| | | | | |
|---|---|---|---|---|
| 4,097,885 A | * | 6/1978 | Walsh | ......................... 257/250 |
| 4,173,765 A | * | 11/1979 | Heald et al. | ................. 257/291 |
| 4,672,645 A | * | 6/1987 | Bluzer et al. | .................. 377/60 |
| 4,695,860 A | * | 9/1987 | Blanchard et al. | .......... 257/249 |
| 5,943,556 A | * | 8/1999 | Hatano et al. | ................ 438/76 |
| 6,689,661 B2 | * | 2/2004 | Durcan et al. | .............. 438/268 |

FOREIGN PATENT DOCUMENTS

| | | |
|---|---|---|
| JP | 05-243177 | 9/1993 |
| JP | 11-204776 | 7/1999 |
| JP | 2004-508727 A | 3/2004 |
| KR | 2002-59684 | 7/2002 |
| WO | WO 02/21573 A2 | 3/2002 |

* cited by examiner

*Primary Examiner*—Donghee Kang
(74) *Attorney, Agent, or Firm*—McDermott Will & Emery LLP

(57) ABSTRACT

A charge-coupled device capable of attaining excellent performance with a single-layer gate electrode structure is obtained. This charge-coupled device, having a single-layer gate electrode structure, comprises a gate insulator film formed on a semiconductor substrate, a plurality of partitions, consisting of an insulator, formed on the gate insulator film, and concave gate electrodes, arranged between adjacent ones of the partitions, having side surfaces formed along side portions of the partitions. Thus, when the partitions are formed with a width of not more than the minimum critical dimension of lithography, the interval between the adjacent gate electrodes is not more than the minimum critical dimension of lithography.

5 Claims, 11 Drawing Sheets

CHARGE-COUPLED DEVICE AND METHOD OF FABRICATING THE SAME

BACKGROUND OF THE INVENTION

1. Field of the Invention

The present invention relates to a charge-coupled device (CCD) and a method of fabricating the same, and more particularly, it relates to a charge-coupled device having a plurality of gate electrodes arranged at a prescribed interval and a method of fabricating the same.

2. Description of the Background Art

A charge-coupled device (CCD) employed for an image sensor or the like is known in general. FIG. 21 is a sectional view showing the structure of a conventional charge-coupled device having a two-layer gate electrode structure. Referring to FIG. 21, a gate insulator film 110 consisting of a silicon oxide film 110a and a silicon nitride film 110b is formed on a silicon substrate 101 in the conventional charge-coupled device. First-layer gate electrodes 120 consisting of polysilicon are formed on the gate insulator film 110 at a prescribed interval. Silicon oxide films 121 are formed on the upper and side surfaces of the first-layer gate electrodes 120.

Second-layer gate electrodes 130 are formed between adjacent ones of the first-layer gate electrodes 120 through the silicon oxide films 121. Impurity regions 102 are formed on surface portions of the silicon substrate 101 located under the second-layer gate electrodes 130. The impurity regions 102 are provided for causing difference between potentials under the adjacent first-layer gate electrodes 120 and the second-layer gate electrodes 130. The charge-coupled device easily transfers charges through the impurity regions 102.

An interlayer dielectric film (not shown) having contact holes is formed on the first-layer gate electrodes 120 and the second-layer gate electrodes 130. The first- and second-layer gate electrodes 120 and 130 are electrically connected to upper wires (not shown) through the contact holes.

Each first-layer gate electrode 120 and each second-layer gate electrode 130 are paired with each other, and the charge-coupled device applies two-phase voltages φ1 and φ2 different from each other to adjacent pairs of the first- and second-layer gate electrodes 120 and 130 respectively thereby transferring charges.

For example, Japanese Patent Laying-Open No. 11-204776 (1999) discloses the aforementioned conventional charge-coupled device having a two-layer gate electrode structure.

FIGS. 22 to 24 are sectional views for illustrating a fabrication process for the conventional charge-coupled device having a two-layer gate electrode structure shown in FIG. 21. The fabrication process for the conventional charge-coupled device having a two-layer gate electrode structure is now described with reference to FIGS. 21 to 24.

First, the silicon oxide film 110a and the silicon nitride film 110b are successively formed on the silicon substrate 101 thereby forming the gate insulator film 110 consisting of the silicon oxide film 110a and the silicon nitride film 110b, as shown in FIG. 22. A polysilicon film (not shown) is deposited on the gate insulator film 110 and thereafter patterned through lithography and etching, thereby forming the first-layer gate electrodes 120.

Then, the surfaces of the first-layer gate electrodes 120 are thermally oxidized thereby forming the silicon oxide films 121 on the upper and side surfaces of the first-layer gate electrodes 120, as shown in FIG. 23. The first-layer gate electrodes 120 are employed as masks for injecting an impurity into the silicon substrate 101, thereby forming the impurity regions 102.

Then, a polysilicon film (not shown) is deposited on the overall surface and thereafter patterned through lithography and etching thereby forming the second-layer gate electrodes 130, as shown in FIG. 24.

Thereafter the interlayer dielectric film (not shown) is formed on the overall surface and formed with the contact holes (not shown). The first- and second-layer gate electrodes 120 and 130 are electrically connected with upper wiring layers (not shown) through the contact holes. Thus, the conventional charge-coupled device having a two-layer gate electrode structure is formed as shown in FIG. 21.

However, the conventional charge-coupled device having a two-layer gate electrode structure shown in FIG. 21 requires the steps of forming the first-layer gate electrodes 120 and forming the second-layer gate electrodes 130, and hence the fabrication process is complicated and working dispersion is disadvantageously easily caused. When the charge-coupled device is employed as an image sensor, difference in spectral sensitivity is disadvantageously caused between the first- and second-layer gate electrodes 120 and 130.

A charge-coupled device having a single-layer gate electrode structure is also proposed in general. According to the single-layer gate electrode structure, single-layer (first-layer) gate electrodes are formed at a prescribed interval, with no formation of second-layer gate electrodes. Therefore, a fabrication process for this charge-coupled device is not complicated and hardly causes working dispersion, dissimilarly to that for the aforementioned charge-coupled device having a two-layer gate electrode structure. Further, this charge-coupled device has no problem of difference in spectral sensitivity between first- and second-layer gate electrodes.

In the charge-coupled device having a single-layer gate electrode structure, however, it is disadvantageously difficult to reduce the interval between adjacent gate electrodes. When forming single-layer gate electrodes at a prescribed interval by patterning gate electrodes through lithography with positive resist or the like, the interval between the gate electrodes is disadvantageously restricted due to limitation of the lithography technique. When patterning the gate electrodes by etching through a mask of a resist film, the gate electrodes are easily reduced in width beyond the pattern of the resist film. Therefore, the interval between the gate electrodes disadvantageously tends to exceed the minimum critical dimension of lithography. Thus, sensitivity or saturation power of the charge-coupled device having a single-layer gate electrode structure is disadvantageously easily reduced due to the easily increased interval between the gate electrodes. Consequently, performance of the charge-coupled device is disadvantageously easily reduced.

In the fabrication process for the charge-coupled device having a two-layer gate electrode structure, the impurity regions 102 can be formed in a self-aligned manner by injecting the impurity into portions located under the regions formed with the second-layer gate electrodes 130 in a self-aligned manner through the masks of the first-layer gate electrodes 120 in the step shown in FIG. 23. Thus, the charge-coupled device can easily transfer charges by driving the gate electrodes 120 and 130 with the two-phase applied voltages φ1 and φ2.

In the fabrication process for the charge-coupled device having a single-layer gate electrode structure, on the other hand, it is difficult to inject an impurity into portions located under specific gate electrodes in a self-aligned manner. In this case, the impurity is selectively injected into the portions located under the specific gate electrodes through a mask of a resist film or the like. When the impurity is injected through the mask of the resist film, however, accuracy in impurity injection depends on the accuracy of the lithography dissimilarly to the case of injecting the impurity in a self-aligned manner, and hence the regions formed by the impurity are disadvantageously dispersed. When the regions formed by the impurity are dispersed, it is difficult to excellently transfer charges. Thus, the charge-coupled device is disadvantageously reduced in charge transferability.

When the charge-coupled device having a single-layer gate electrode structure substitutes for the conventional charge-coupled device having a two-layer gate electrode structure, performance of the charge-coupled device such as sensitivity or saturation power is disadvantageously reduced due to the increased interval between the gate electrodes, as hereinabove described. In the single-layer gate electrode structure, further, the positions formed with the impurity regions are dispersed under the specific gate electrodes, and hence the charge-coupled device is also reduced in performance such as charge transferability.

SUMMARY OF THE INVENTION

An object of the present invention is to provide a charge-coupled device capable of attaining excellent performance with a single-layer gate electrode structure.

Another object of the present invention is to provide a method of fabricating a charge-coupled device capable of easily fabricating a charge-coupled device capable of attaining excellent performance with a single-layer gate electrode structure.

In order to attain the aforementioned objects, a charge-coupled device according to a first aspect of the present invention, having a single-layer gate electrode structure, comprises a gate insulator film formed on a semiconductor substrate, a plurality of partitions consisting of an insulator formed on the gate insulator film and a concave gate electrode, arranged between adjacent partitions, having side surfaces formed along side portions of the partitions.

The charge-coupled device according to the first aspect is provided with the concave gate electrode having side surfaces formed along the side portions of the partitions between the adjacent partitions as hereinabove described, whereby the interval between adjacent gate electrodes can be controlled in response to the width of the partitions. When the partitions are formed by anisotropic etching through a mask of a resist film formed with the minimum critical dimension of lithography, for example, the width of the partitions can be rendered identical to or slightly smaller than the minimum critical dimension of lithography, whereby the interval between the adjacent gate electrodes can be reduced below the minimum critical dimension of lithography. When the partitions are formed by isotropic etching through a mask of a resist film formed with the minimum critical dimension of lithography, the width of the partitions is reduced below the minimum critical dimension of lithography, whereby the interval between the adjacent gate electrodes can be reduced below the minimum critical dimension of lithography. Thus, the interval between the adjacent gate electrodes can be reduced also when employing the single-layer gate electrode structure, whereby performance such as sensitivity or saturation power can be improved. Consequently, the charge-coupled device can attain excellent performance with the single-layer gate electrode structure.

In the aforementioned charge-coupled device according to the first aspect, the gate insulator film preferably includes a first gate insulator film and a second gate insulator film, formed on the first gate insulator film, consisting of a different material from the first gate insulator film. According to this structure, the second gate insulator film can ensure an etching selection ratio with respect to the partitions while the first gate insulator film attains excellent interfacial characteristics with respect to the semiconductor substrate.

In the aforementioned charge-coupled device according to the first aspect, the partitions preferably include a first partition and a second partition, formed on the first partition, consisting of a different material from the first partition. When the partitions are made of two types of different materials, the second partition can attain a function for serving as a stopper in a CMP (chemical mechanical polishing) step while the first partition ensures an etching selection ratio with respect to the gate insulator film, for example.

In the aforementioned charge-coupled device according to the first aspect, the partitions are preferably formed to have a width not more than the minimum critical dimension of lithography. According to this structure, the interval between adjacent gate electrodes can be easily reduced below the minimum critical dimension of lithography. In this case, the partitions are preferably formed to have a width smaller than the minimum critical dimension of lithography. According to this structure, the interval between adjacent gate electrodes can be easily reduced below the minimum critical dimension of lithography, whereby the interval between the adjacent gate electrodes can be further reduced in the single-layer gate electrode structure.

In the aforementioned charge-coupled device according to the first aspect, the partitions are preferably formed by etching through a mask of a resist film to have a width not more than the width of the resist film. According to this structure, the partitions can be easily formed to have a width not more than the minimum critical dimension of lithography by forming the resist film with the width of the minimum critical dimension of lithography.

In the aforementioned charge-coupled device according to the first aspect, portions of the gate insulator film located on the interfaces between the gate insulator film and the partitions and portions of the partitions located on the interfaces between the gate insulator film and the partitions are preferably made of materials having different etching selection ratios. According to this structure, a layer located on the gate insulator film for defining the partitions can be easily selectively etched for forming the partitions.

In the aforementioned charge-coupled device according to the first aspect, the concave gate electrodes are preferably formed to be adjacent to each other through the partitions, and the charge-coupled device preferably further comprises a first impurity region formed on a surface portion of the semiconductor substrate located under one of the adjacent gate electrodes. According to this structure, the first impurity region can smooth change of potentials between regions located under the adjacent gate electrodes when a voltage is applied to the gate electrodes.

A charge-coupled device according to a second aspect of the present invention, having a single-layer gate electrode structure, comprises a gate insulator film formed on a semiconductor substrate and a concave gate electrode formed on the gate insulator film.

In the charge-coupled device according to the second aspect, the concave gate electrode is provided on the gate insulator film formed on the semiconductor substrate as hereinabove described, whereby an impurity can be injected into a surface portion of the semiconductor substrate located under the concave inner bottom of the gate electrode in a self-aligned manner when forming a first impurity region by injecting the impurity into a portion located under the gate electrode through a mask of the concave side portion of the gate electrode. Thus, the region formed with the first impurity region can be prevented from dispersion dissimilarly to a case of injecting the impurity through a mask of a resist film. Consequently, charge transferability can be prevented from reduction resulting from dispersion of the region formed with the first impurity region, whereby the charge-coupled device can attain excellent performance.

In the aforementioned charge-coupled device according to the second aspect, the concave gate electrodes are preferably formed to be adjacent to each other at a prescribed interval, and the charge-coupled device preferably further comprises a first impurity region formed on a surface portion of the semiconductor substrate located under one of the adjacent gate electrodes. According to this structure, the first impurity region can cause difference between potentials in regions located under the adjacent gate electrodes when a voltage is applied to the gate electrode.

In the aforementioned charge-coupled device according to the second aspect, the concave gate electrodes are preferably formed to be adjacent to each other at a prescribed interval, and the charge-coupled device preferably further comprises a second impurity region formed on a surface portion of the semiconductor substrate located under one of the adjacent gate electrodes. According to this structure, the second impurity region can smooth change of potentials between regions located under the adjacent gate electrodes when a voltage is applied to the gate electrodes.

The aforementioned charge-coupled device according to the second aspect preferably further comprises a pair of source/drain regions formed to hold a channel region located on a surface portion of the semiconductor substrate located under the concave gate electrode, and the concave gate electrode, the gate insulator film and the pair of source/drain regions preferably form a transistor. According to this structure, a transistor employed as a driver element for an output part can be easily obtained.

In the aforementioned charge-coupled device according to the second aspect, the concave gate electrodes are preferably formed to be adjacent to each other at a prescribed interval, and the charge-coupled device preferably further comprises a further partition, consisting of an insulator and having side portions formed to be in contact with the side surfaces of the concave gate electrodes, between the adjacent concave gate electrodes. According to this structure, the interval between the adjacent gate electrodes can be controlled in response to the width of the partitions. When the partitions are formed by anisotropic etching through a mask of a resist film formed with the minimum critical dimension of lithography, for example, the width of the partitions can be rendered identical to or slightly smaller than the minimum critical dimension of lithography, whereby the interval between the adjacent gate electrodes can be reduced below the minimum critical dimension of lithography. When the partitions are formed by isotropic etching through a mask of a resist film formed with the minimum critical dimension of lithography, the width of the partitions is reduced below the minimum critical dimension of lithography, whereby the interval between the adjacent gate electrodes can be reduced below the minimum critical dimension of lithography. Thus, the interval between the adjacent gate electrodes can be reduced also when employing the single-layer gate electrode structure, whereby performance such as sensitivity or saturation power can be improved. Consequently, the charge-coupled device can attain excellent performance with the single-layer gate electrode structure.

A method of fabricating a charge-coupled device, having a single-layer gate electrode structure, according to a third aspect of the present invention comprises steps of forming a gate insulator film on a semiconductor substrate, forming a plurality of partitions consisting of an insulator on the gate insulator film, forming a gate electrode layer on the gate insulator film along side portions of the partitions and polishing the gate electrode layer to expose at least the upper surfaces of the partitions thereby forming a concave gate electrode between adjacent partitions.

In the method of fabricating a charge-coupled device according to the third aspect, the interval between adjacent gate electrodes can be controlled in response to the width of the partitions by forming the gate electrode layer on the gate insulator film along the side portions of the partitions and thereafter polishing the gate electrode layer to expose at least the upper surfaces of the partitions thereby forming the concave gate electrode between the adjacent partitions, as hereinabove described. When the partitions are formed by anisotropic etching through a mask of a resist film formed with the minimum critical dimension of lithography, for example, the width of the partitions can be rendered identical to or slightly smaller than the minimum critical dimension of lithography, whereby the interval between the adjacent gate electrodes can be reduced below the minimum critical dimension of lithography. When the partitions are formed by isotropic etching through a mask of a resist film formed with the minimum critical dimension of lithography, the width of the partitions is reduced below the minimum critical dimension of lithography, whereby the interval between the adjacent gate electrodes can be reduced below the minimum critical dimension of lithography. Thus, the interval between the adjacent gate electrodes can be reduced also when employing the single-layer gate electrode structure, whereby performance such as sensitivity or saturation power can be improved. Consequently, a charge-coupled device capable of attaining excellent performance with the single-layer gate electrode structure can be easily fabricated.

In the aforementioned method of fabricating a charge-coupled device according to the third aspect, the step of forming the partitions preferably includes steps of forming a partition layer consisting of an insulator on the gate insulator film and thereafter forming a first resist film on a prescribed region of the partition layer and anisotropically etching the partition layer through a mask of the first resist film thereby forming the partitions having a width not more than equivalent to the width of the first resist film. According to this structure, the partitions can be easily formed with a width not more than the minimum critical dimension of lithography, whereby the interval between adjacent gate electrodes can be reduced below the minimum critical dimension of lithography.

In the aforementioned method of fabricating a charge-coupled device according to the third aspect, the step of forming the partitions preferably includes steps of forming a partition layer consisting of an insulator on the gate insulator film and thereafter forming a first resist film on a prescribed region of the partition layer and isotropically etching the partition layer through a mask of the first resist film thereby forming the partitions having a smaller width than the first resist film. According to this structure, the partitions can be easily formed with a width not more than the minimum critical dimension of lithography, whereby the interval between adjacent gate electrodes can be reduced below the minimum critical dimension of lithography.

The aforementioned method of fabricating a charge-coupled device according to the third aspect preferably further comprises steps of forming a second resist film on a prescribed region of the gate electrode layer after the step of forming the gate electrode layer and selectively introducing an impurity into a surface portion of the semiconductor substrate located under a region held between adjacent partitions through masks of portions of the second resist film and the gate electrode layer along side portions of the partitions thereby forming a first impurity region. According to this structure, the impurity can be injected into a surface portion of the semiconductor substrate located under the concave inner bottom of the gate electrode in a self-aligned manner, thereby preventing a region formed with the first impurity region from dispersion. Thus, charge transfer performance can be prevented from reduction resulting from dispersion of the region formed with the first impurity region, whereby the charge-coupled device can attain excellent performance.

The aforementioned method of fabricating a charge-coupled device according to the third aspect preferably further comprises steps of removing a prescribed partition from among the plurality of partitions after the step of forming the concave gate electrode and selectively introducing an impurity into a surface portion of the semiconductor substrate located under a region from which the partition is removed thereby forming a second impurity region. According to this structure, the second impurity region for smoothing change of potentials between regions located under adjacent gate electrodes when a voltage is applied to the gate electrodes can be easily formed.

In the aforementioned method of fabricating a charge-coupled device according to the third aspect, the step of forming the partitions preferably includes a step of forming the partitions having at least upper portions consisting of silicon nitride films, and the step of forming the concave gate electrode preferably includes a step of polishing the gate electrode layer through CMP employing at least the upper portions of the partitions as stoppers thereby forming the concave gate electrode. According to this structure, the concave gate electrode can be easily formed through CMP.

The aforementioned method of fabricating a charge-coupled device according to the third aspect preferably further comprises a step of forming a protective film to cover the surface of the gate electrode layer in advance of the step of forming the concave gate electrode, and the step of forming the concave gate electrode preferably includes a step of polishing the protective film and the gate electrode layer to expose at least the upper surfaces of the partitions thereby forming the concave gate electrode between adjacent partitions. According to this structure, the gate electrode layer consisting of a polysilicon film or the like can be excellently polished through the protective film.

In the aforementioned method of fabricating a charge-coupled device according to the third aspect, the step of forming the gate insulator film preferably includes a step of preparing portions of the gate insulator film located on the interfaces between the gate insulator film and the partitions from a prescribed material, and the step of forming the partitions preferably includes a step of preparing portions of the partitions located on the interfaces between the gate insulator film and the partitions from a material having a different etching selection ratio from the prescribed material. According to this structure, a portion of the partition layer located on the gate insulator film can be easily selectively etched when forming the partitions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A first embodiment of the present invention is now described with reference to a charge-coupled device having a single-layer gate electrode structure and a method of fabricating the same applied to a frame transfer CCD image sensor 90 and a method of fabricating the same.

Figure 1:
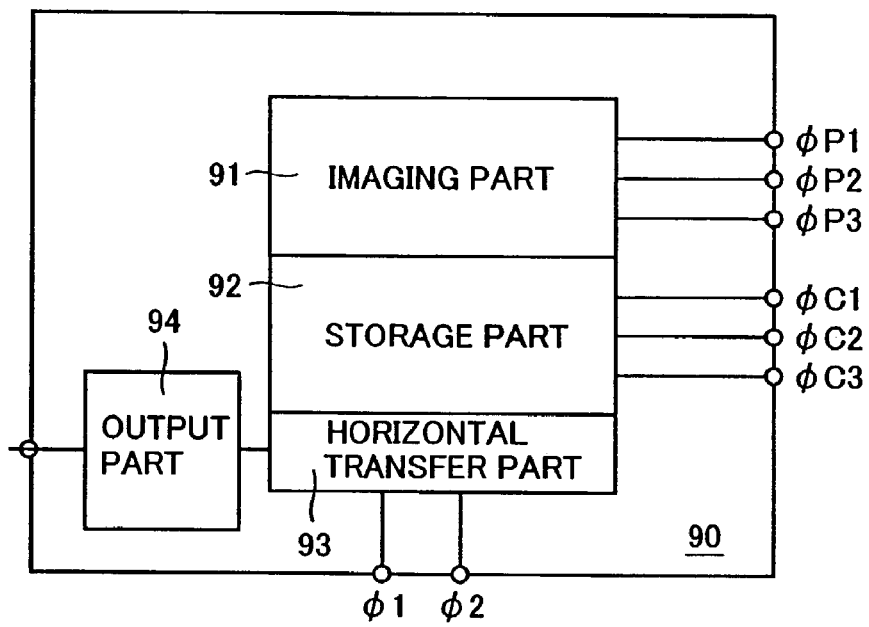
FIG. 1 is a block diagram showing the overall structure of a charge-coupled device according to a first embodiment of the present invention.

First, the overall structure of the charge-coupled device (CCD image sensor) 90 according to the first embodiment is described with reference to FIG. 1. The CCD image sensor 90 according to the first embodiment comprises an imaging part 91 performing photoelectric conversion, a storage part 92 for temporarily storing charges photoelectrically converted by the imaging part 91, a horizontal transfer part 93 for transferring the charges stored in the storage part 92 to an output part 94 and the output part 94 for outputting the charges transferred from the horizontal transfer part 93.

In operation, the imaging part 91 performs photoelectric conversion corresponding to an irradiated optical image. The imaging part 91 transfers (frame-shifts) the charges photoelectrically converted every pixel to the storage part 92 every frame at a high speed. The horizontal transfer part 93 transfers a charge pattern formed in the storage part 92 to the output part 94 at a high speed every line. The output part 94 outputs a signal transferred thereto to a signal processing system (not shown) as an imaging signal of the CCD image sensor 90.

The CCD image sensor 90 performs the aforementioned charge transfer operation by applying voltages to gate electrodes of the imaging part 91, the storage part 92 and the horizontal transfer part 91. More specifically, the CCD image sensor 90 applies different three-phase voltages φP1 to φP3 and φC1 to φC3 to prescribed gate electrodes of the imaging part 91 and the storage part 92 thereby transferring charges. The CCD image sensor 90 further applies different two-phase voltages φ1 and φ2 to prescribed gate electrodes of the horizontal transfer part 93 thereby transferring charges.

The sectional structure of the horizontal transfer part 93 of the CCD image sensor 90 according to the first embodiment is now described with reference to FIG. 2. In the horizontal transfer part 93, a silicon oxide film ($SiO_2$ film) 10a having a thickness of about 10 nm to about 50 nm (about 30 nm in the first embodiment) is formed on a silicon substrate 1. A silicon nitride film (SiN film) 10b having a thickness of about 30 nm to about 100 nm (about 80 nm in the first embodiment) is formed on the silicon oxide film 10a. The silicon oxide film 10a and the silicon nitride film 10b form a gate insulator film 10. The silicon substrate 1 is an example of the "semiconductor substrate" in the present invention, and the silicon oxide film 10a is an example of the "first gate insulator film" in the present invention. The silicon nitride film 10b is an example of the "second gate insulator film" in the present invention.

According to the first embodiment, a plurality of partitions 20 are formed on the gate insulator film 10 at a prescribed interval. Each partition 20 is formed by a silicon oxide film 20a having a thickness of about 50 nm to about 300 nm (about 200 nm in the first embodiment) formed on the silicon nitride film 10b constituting the gate insulator film 10 and a silicon nitride film (SiN film) 20b having a thickness of about 10 nm to about 100 nm (about 50 nm in the first embodiment) formed on the silicon oxide film 20a. The partitions 20 are about 0.05 μm to about 0.2 μm in width, and the interval between the adjacent ones of the partitions 20 is set to about 0.3 μm to about 3 μm. The silicon oxide film 20a is an example of the "first partition" in the present invention, and the silicon nitride film 20b is an example of the "second partition" in the present invention.

Concave gate electrodes 30 are formed between the adjacent partitions 20 provided on the gate insulator film 10 so that side surfaces thereof are in contact with side portions of the partitions 20. The concave gate electrodes 30 consist of polysilicon films having a thickness of about 30 nm to about 100 nm (about 50 nm in the first embodiment). Protective films 42 consisting of silicon oxide are formed on concave inner surfaces of the concave gate electrodes 30 with a thickness of about 5 nm to about 50 nm. Adjacent ones of the gate electrodes 30 are arranged at a prescribed interval to coincide with the direction of horizontal transfer. Thus, the CCD image sensor 90 has a single-layer gate electrode structure. The upper surfaces of the partitions 20 and those of the side portions of the gate electrodes 30 are flattened.

An interlayer dielectric film (not shown) consisting of silicon oxide is formed to cover the overall surface, while contact holes (not shown) reaching the gate electrodes 30 are formed in this interlayer dielectric film. The gate electrodes 30 are connected to upper wires (not shown) through the contact holes.

A P well 3 and an N well 4 are formed in the silicon substrate 1. N- and P-type high-concentration impurity regions 2 are alternately formed under the adjacent gate electrodes 30 in the N well 4. The high-concentration impurity regions 2 control impurity concentrations under the adjacent gate electrodes 30 to be different from each other. Thus, the CCD image sensor 90, can drive the horizontal transfer part 93 with the two-phase applied voltages φ1 and φ2. The high-concentration impurity regions 2 are examples of the "first impurity region" in the present invention.

The sectional structure of each of the imaging part 91 and the storage part 92 of the CCD image sensor 90 according to the first embodiment is now described with reference to FIG. 3. As shown in FIG. 3, the sectional structure of each of the imaging part 91 and the storage part 92 is similar to that of the horizontal transfer part 93 shown in FIG. 2 except that no high-concentration impurity regions 2 are formed. The remaining structures of the imaging part 91 and the storage part 92 are similar to that of the horizontal transfer part 93 shown in FIG. 2. Referring to the structure of each of the imaging part 91 and the storage part 92 shown in FIG. 3, the CCD image sensor 90 applies the different three-phase signals φP1, φP2 and φP3 (φC1, φC2 and φC3) to three adjacent gate electrodes 30 respectively. Thus, the CCD image sensor 90 transfers charges.

Figure 4:
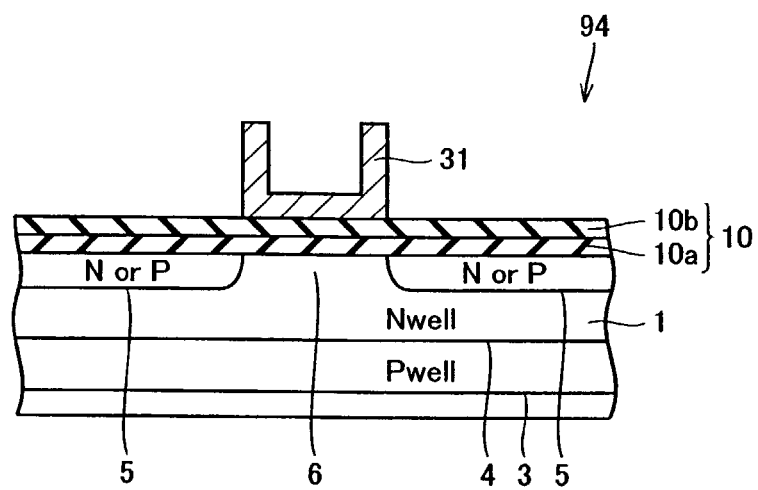
FIG. 4 is a sectional view of an output part of the charge-coupled device according to the first embodiment of the present invention.

The sectional structure of the output part 94 of the CCD image sensor 90 according to the first embodiment is described with reference to FIG. 4. In this output part 94, a pair of N- or P-type source/drain regions 5 are formed on the surface of the silicon substrate 1 to hold a channel region 6 therebetween. A concave gate electrode 31 is formed on the channel region 6 through the gate insulator film 10. The gate electrode 31, the gate insulator film 10 and the pair of source/drain regions 5 form a MOS transistor serving as a driver element for the output part 94.

Figure 2:
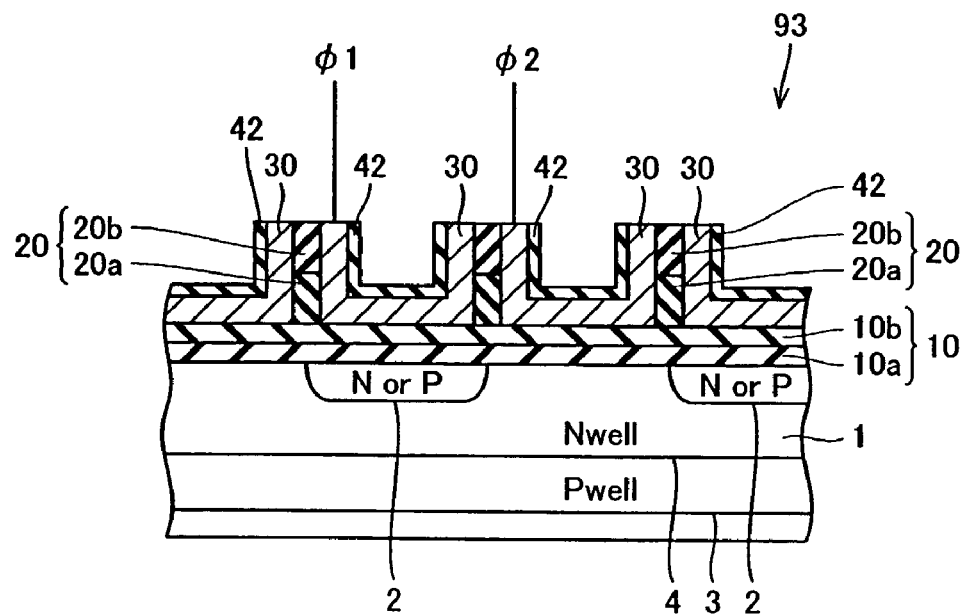
FIG. 2 is a sectional view of a horizontal transfer part of the charge-coupled device according to the first embodiment of the present invention.
Figure 3:
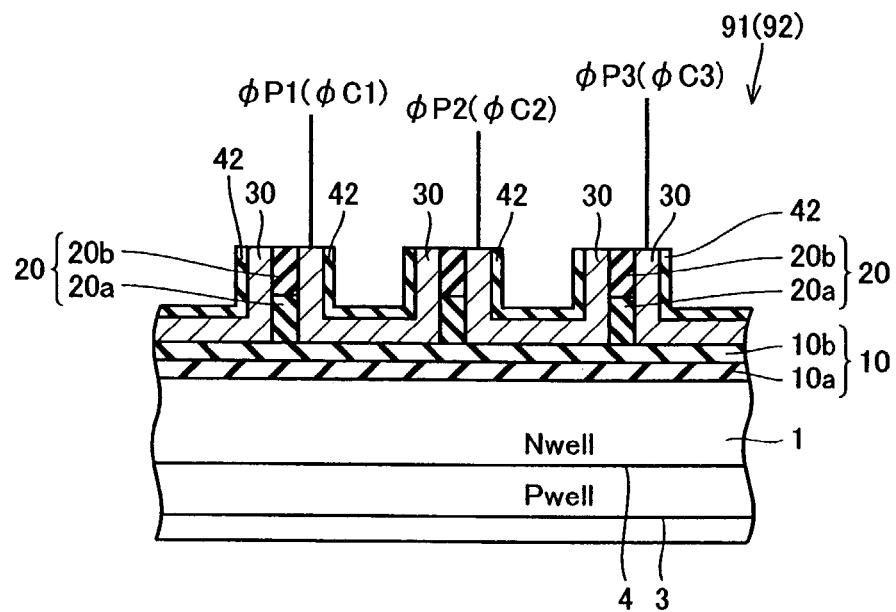
FIG. 3 is a sectional view showing an imaging part and a storage part of the charge-coupled device according to the first embodiment of the present invention.

According to the first embodiment, the concave gate electrodes 30 having side surfaces formed along the side portions of the partitions 20 are provided between the adjacent partitions 20 as shown in FIGS. 2 and 3, whereby the interval between the adjacent gate electrodes 30 can be controlled in response to the width of the partitions 20. When the partitions 20 are formed by anisotropic etching through a mask of a resist film formed with the minimum critical dimension of lithography, for example, the width of the partitions 20 is equalized with or can be slightly smaller than the minimum critical dimension of lithography, whereby the interval between the adjacent gate electrodes 30 can be reduced below the minimum critical dimension of lithography. When the partitions 20 are formed by isotropic etching through a mask of a resist film formed with the minimum critical dimension of lithography, the width of the partitions 20 is reduced below the minimum critical dimension of lithography and hence the interval between the adjacent gate electrodes 30 can be reduced below the minimum critical dimension of lithography.

Thus, according to the first embodiment, the interval between the adjacent gate electrodes 30 can be reduced also when the gate electrodes 30 are in the single-layer structure, whereby the CCD image sensor 90 can be improved in performance such as sensitivity or saturation power. Consequently, the CCD image sensor 90 can attain excellent performance with the single-layer gate electrodes 30.

According to the first embodiment, the silicon nitride film 10b defines layers located on the interfaces between the gate insulator film 10 and the partitions 20 and the silicon oxide films 20a define layers located on the interfaces between the partitions 20 and the gate insulator film 10, whereby an etching selection ratio can be ensured in a process of forming the partitions 20 as described later. Thus, the partitions 20 can be easily formed.

According to the first embodiment, the gate insulator film 10 has the two-layer structure of the silicon oxide film 10a and the silicon nitride film 10b as hereinabove described, whereby the silicon nitride film 10b can ensure the etching selection ratio in formation of the partitions 20 while the silicon oxide film 10a attains excellent interfacial characteristics with respect to the silicon substrate 1.

According to the first embodiment, the lower silicon oxide films 20a and the upper silicon nitride films 20b form the partitions 20 as hereinabove described, whereby the lower silicon oxide films 20a can ensure the etching selection ratio with respect to the gate insulator film 10 and the upper silicon nitride films 20b can attain a function as stoppers in a CMP step for forming the gate electrodes 30.

According to the first embodiment, the gate electrodes 30 are so concavely formed that an impurity can be injected into surface portions of the silicon substrate 1 located under the concave inner bottoms of the gate electrodes 30 in a self-aligned manner through masks of the concave side portions of the gate electrodes 30 in a process of forming the high-concentration impurity regions 2 described later, whereby regions formed with the high-concentration impurity regions 2 can be prevented from dispersion dissimilarly to a case of injecting the impurity through a mask formed by only a resist film. Thus, charge transfer performance can be prevented from reduction resulting from dispersion of the regions formed with the high-concentration impurity regions 2, whereby the CCD image sensor 90 can attain excellent performance also by this.

Figure 11:
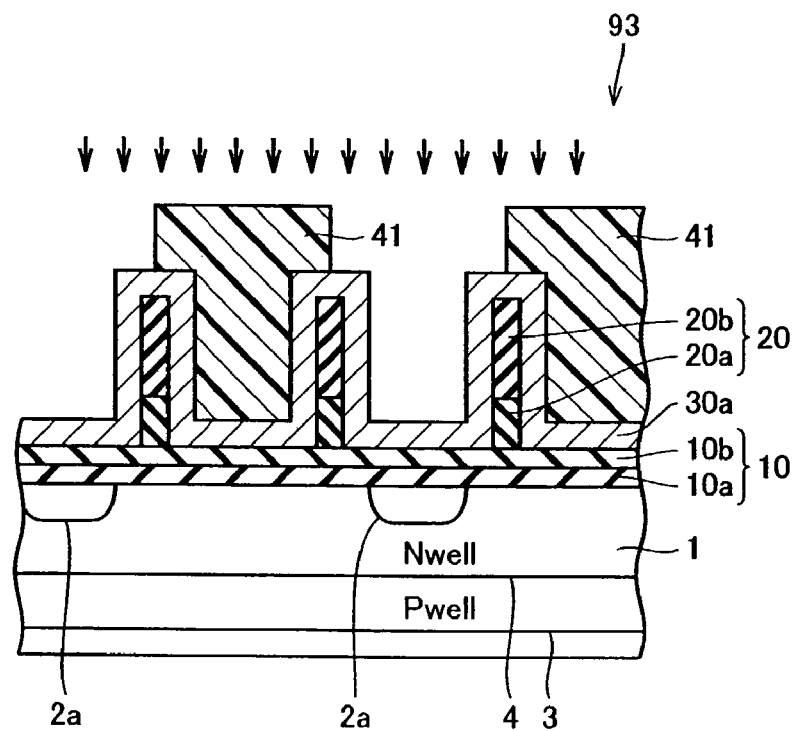
FIGS. 11 and 12 are sectional views for illustrating an impurity injection process for the horizontal transfer part of the charge-coupled device according to the first embodiment of the present invention.
Figure 12:
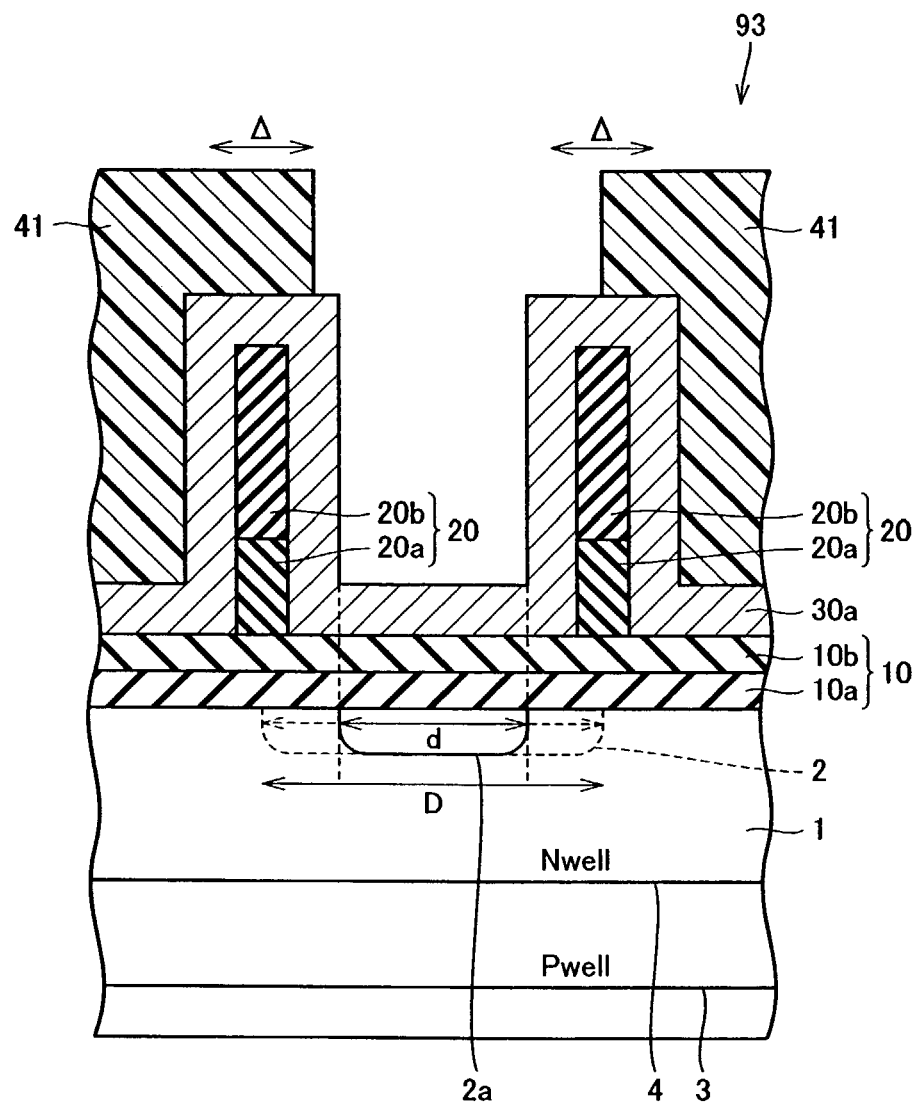

A process of fabricating the charge-coupled device 90 according to the first embodiment is now described with reference to FIGS. 5 to 14. Steps shown in FIGS. 5 to 10, 13 and 14 are those of a process common to the imaging part 91, the storage part 92 and the horizontal transfer part 93. A process shown in FIGS. 11 and 12 is specific to the horizontal transfer part 93.

Figure 5:
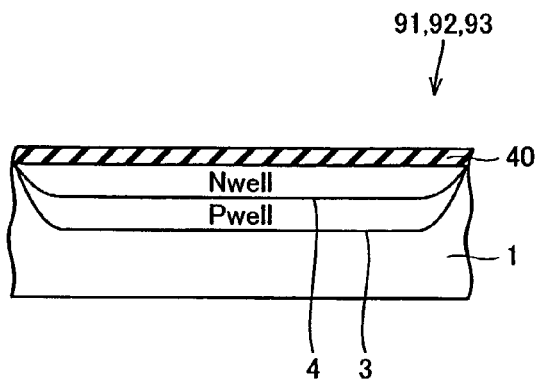
FIG. 5 is a sectional view for illustrating a process of forming a well region of the charge-coupled device according to the first embodiment of the present invention.

As shown in FIG. 5, the silicon substrate 1 is heat-treated under a temperature condition of about 850° C. to about 1050° C. (about 950° C. in the first embodiment) thereby forming a pad oxide film 40 having a thickness of about 5 nm to about 40 nm (about 20 nm in the first embodiment). The P well 3 and the N well 4 are formed through the pad oxide film 40. More specifically, boron (B) is injected into the silicon substrate 1 under conditions of injection energy of about 100 keV to about 200 keV (150 keV in the first embodiment) and an injection rate of about $1 \times 10^{11}$ /cm$^2$ to $1 \times 10^{12}$/cm$^2$ (about $5 \times 10^{11}$/cm$^2$ in the first embodiment) thereby forming the P well 3. Then, arsenic (As) is injected into the silicon substrate 1 under conditions of injection energy of about 50 keV to about 200 keV (about 50 keV in the first embodiment) and an injection rate of about $1 \times 10^{11}$/cm$^2$ to $1 \times 10^{12}$/cm$^2$ (about $5 \times 10^{11}$/cm$^2$ in the first embodiment) thereby forming the N well 4.

Figure 6:
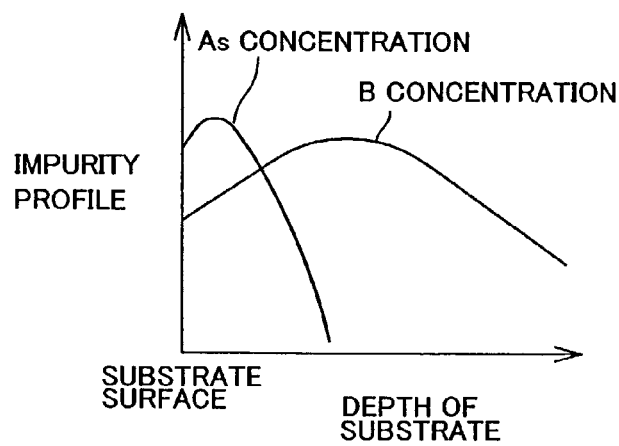
FIG. 6 is an impurity profile chart of the well region shown in FIG. 5.

Thus, impurities are injected into the silicon substrate 1 in concentration distribution shown in FIG. 6. Therefore, the silicon substrate 1 exhibits potential distribution shown in FIG. 7.

It is preferable to thereafter further inject an impurity, in order to perform pixel separation. The imaging part 91 and the storage part 92 are provided with striped impurity-injected regions along the direction of transfer, in order to subdivide pixels. The horizontal transfer part 93 is provided on both sides with striped impurity-injected regions along the direction of transfer to hold pixels. This pixel separation is performed by injecting boron (B) into the silicon substrate 1 under conditions of injection energy of about 10 keV to about 100 keV (about 30 keV in the first embodiment) and an injection rate of about $1 \times 10^{11}$/cm$^2$ to $1 \times 10^{13}$/cm$^2$ (about $1 \times 10^{12}$/cm$^2$ in the first embodiment).

Figure 8:
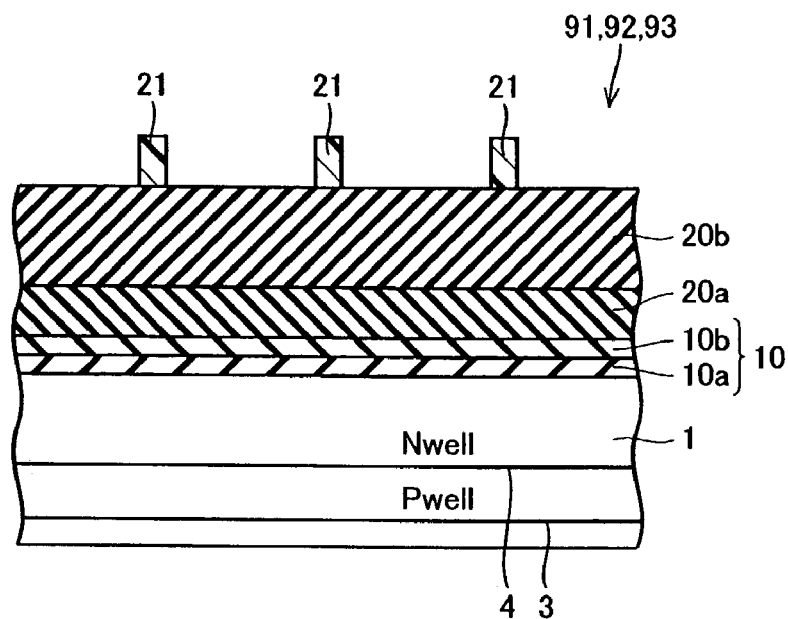
FIGS. 8 to 10 are sectional views for illustrating a fabrication process for the imaging part, the storage part and the horizontal transfer part of the charge-coupled device according to the first embodiment of the present invention.

The pad oxide film 40 is removed and thereafter the silicon substrate 1 is heat-treated at a temperature of about 850° C. to about 1050° C. (about 950° C. in the first embodiment) thereby forming the silicon oxide film 10a having the thickness of about 10 nm to about 50 nm (about 30 nm in the first embodiment), as shown in FIG. 8. Then, the silicon nitride film 10b having the thickness of about 30 nm to about 100 nm (about 80 nm in the first embodiment) is formed under a temperature condition of about 600° C. to about 800° C. (about 700° C. in the first embodiment) by low pressure chemical vapor deposition (LPCVD), thereby forming the gate insulator film 10 consisting of the silicon oxide film 10a and the silicon nitride film 10b.

Thereafter a silicon oxide film 20a having a thickness of about 50 nm to about 300 nm (about 200 nm in the first embodiment) is formed on the silicon nitride film 10b under a temperature condition of about 600° C. to about 800° C. (about 700° C. in the first embodiment) by LPCVD. Then, a silicon nitride film 20b having a thickness of about 10 nm to about 100 nm (about 50 nm in the first embodiment) is formed on the silicon oxide film 20a under a temperature condition of about 600° C. to about 800° C. (about 700° C. in the first embodiment) by LPCVD. Resist films 21 are formed on prescribed regions of the silicon nitride film 20b.

Figure 9:
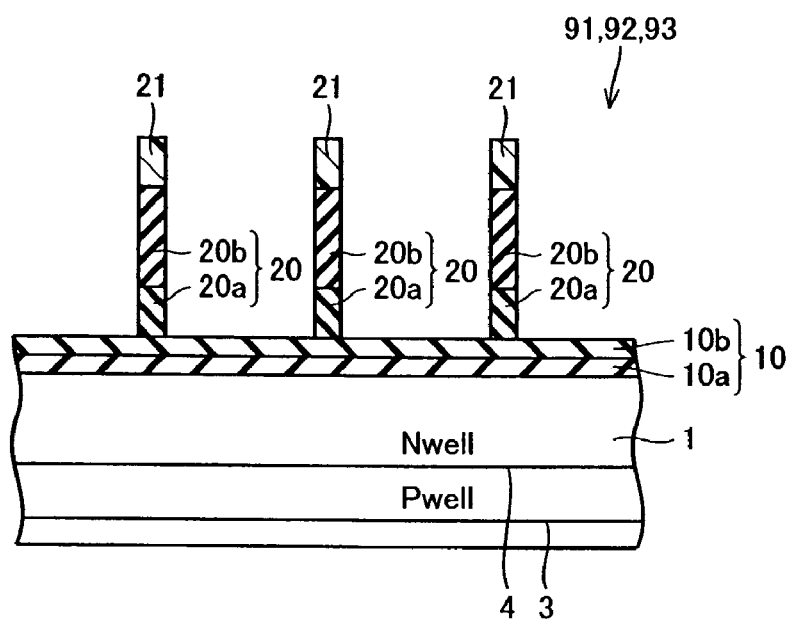

As shown in FIG. 9, the resist films 21 are employed as masks for anisotropically etching the silicon nitride film 20b and the silicon oxide film 20a thereby forming the partitions 20 having a width of about 0.13 μm to about 0.2 μm. In this case, conditions for the anisotropic etching are as follows:

Frequency: about 400 kHz

Power: about 150 W to about 600 W (about 400 W in the first embodiment)

$CHF_3$ Flow Rate: about $2 \times 10^{-5} m^3$/min. to $4 \times 10^{-5} m^3$/min. (about $3 \times 10^{-5} m^3$/min. in the first embodiment)

$CF_4$ Flow Rate: about $1 \times 10^{-5} m^3$/min. to about $3 \times 10^{-5} m^3$/min. (about $2 \times 10^{-5} m^3$/min. in the first embodiment)

Ar Flow Rate: about $3 \times 10^{-4} m^3$/min. to about $6 \times 10^{-4} m^3$/min. (about $5 \times 10^{-4} m^3$/min. in the first embodiment)

Pressure: about 27 Pa to about 80 Pa (about 33 Pa in the first embodiment)

Substrate Temperature: about −10° C.

It is assumed that the gas flow rates are values in a standard state.

The width of the partitions 20 can be reduced to the limit of lithography by performing anisotropic etching under the aforementioned conditions. For example, the width of the resist films 21 can be reduced to about 0.13 μm with an ArF excimer laser. When forming the partitions 20 by performing anisotropic etching through the resist films 21 serving as masks in this case, the width of the partitions 20 can be easily rendered identical to or slightly smaller than the width of the resist films 21. Thus, the width of the partitions 20 can be reduced to about 0.13 μm or slightly smaller than 0.13 μm. Thereafter the resist films 21 are removed.

Figure 10:
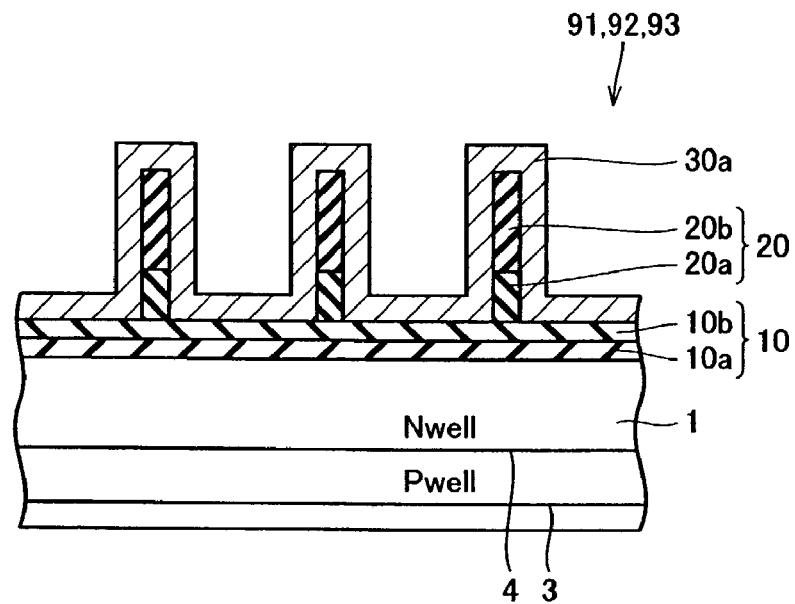

Then, a polysilicon film 30a is formed by CVD with a thickness of about 30 nm to about 100 nm (about 50 nm in the first embodiment) to cover the overall surface and come into contact with the side surfaces of the partitions 20, as shown in FIG. 10.

The process up to the aforementioned step shown in FIG. 10 is common to the imaging part 91, the storage part 92 and the horizontal transfer part 93. The subsequent process shown in FIGS. 11 and 12 is specific to the horizontal transfer part 93. More specifically, resist films 41 are formed to cover portions of the horizontal transfer part 93 not subjected to impurity injection, the imaging part 91, the storage part 92 and the output part 94. The resist films 41 are employed as masks for ion-implanting boron (B) into the silicon substrate 1 under conditions of injection energy of about 10 keV to about 50 keV (about 30 keV in the first embodiment) and an injection rate of about $2 \times 10^{11}/cm^2$ to about $5 \times 10^{12}/cm^2$ (about $2 \times 10^{11}/cm^2$ in the first embodiment). In this case, P-type high-concentration impurity regions 2a are formed. In place of boron (B), arsenic (As) may be ion-implanted into the silicon substrate 1 through the masks of the resist films 41 under conditions of injection energy of about 10 keV to about 100 keV (about 60 keV in the first embodiment) and an injection rate of about $1 \times 10^{11}/cm^2$ to about $5 \times 10^{12}/cm^2$ (about $2 \times 10^{11}/cm^2$ in the first embodiment). In this case, N-type high-concentration impurity regions 2a are formed.

In this ion implantation, the side surfaces of the polysilicon film 30a for defining the concave gate electrodes 30 formed along the side walls of the partitions 20 serve as masks also when the positions for forming the resist films 41 are displaced. Therefore, the impurity can be injected into the silicon substrate 1 in a self-aligned manner. Even if errors Δ take place in accuracy of formation of the resist films 41 as shown in FIG. 12, the impurity is injected into a region d between portions of the polysilicon film 30a covering opposite side portions of the adjacent partitions 20. Therefore, the resist films 41 are preferably formed not to project from the side portions of the polysilicon film 30a toward the region subjected to impurity injection in consideration of the errors Δ in formation of the resist films 41.

After the aforementioned injection, the resist films 41 are removed. Annealing is performed for activating the regions 2a containing the injected impurity. This annealing is performed in an annealing furnace at a temperature of about 800° C. to about 1100° C. (about 900° C. in the first embodiment) for about 10 minutes to about 100 minutes (30 minutes in the first embodiment). Due to this annealing, the regions 2a containing the injected impurity are electrically activated and the injected impurity horizontally diffuses through the silicon substrate 1, as shown in FIG. 12. Therefore, the concentration distribution of the impurity can be adjusted by adjusting the conditions for this annealing. According to the first embodiment, annealing is preferably so performed that the impurity diffuses up to portions (D in FIG. 12) around the centers of the partitions 20, thereby forming the high concentration impurity regions 2.

Figure 7:
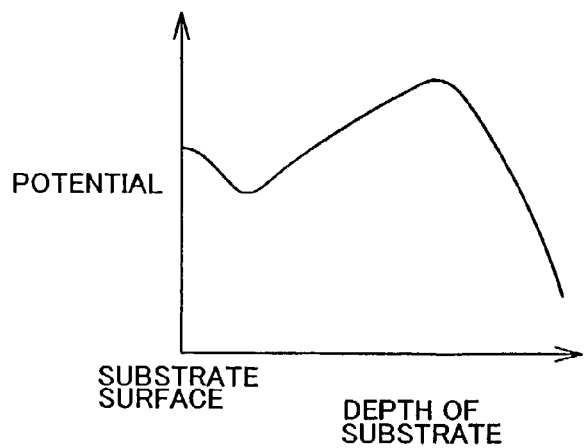
FIG. 7 is a characteristic diagram showing the relation between a substrate depth direction and potentials in the well region shown in FIG. 5.

The potentials of the high concentration impurity regions 2 formed in the aforementioned manner can differ from those shown in FIG. 7. Thus, the regions located under the adjacent gate electrodes 30 (see FIG. 2) can exhibit potentials different from each other. Consequently, the CCD image sensor 90 can drive the horizontal transfer part 93 with the two-phase voltages φ1 and φ2.

Figure 13:
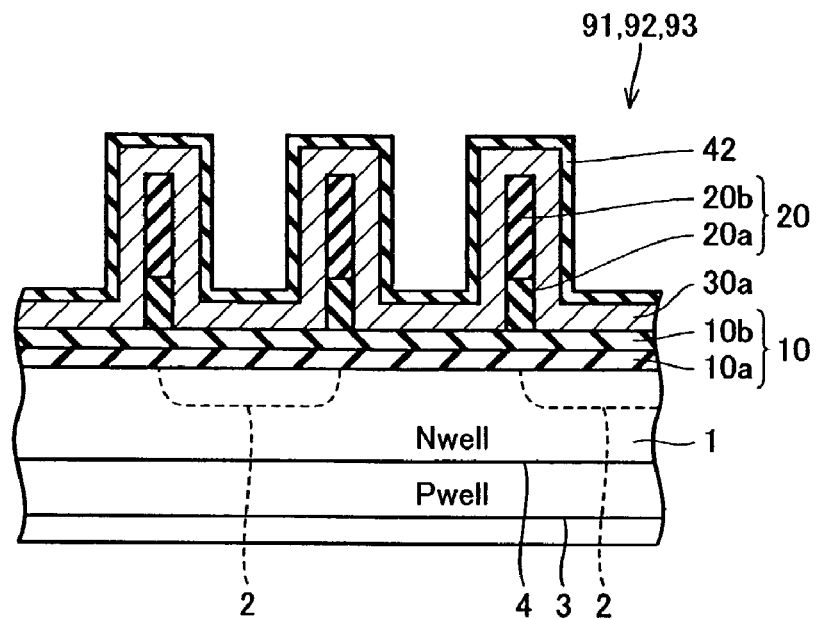
FIGS. 13 and 14 are sectional views for illustrating the fabrication process for the imaging part, the storage part and the horizontal transfer part of the charge-coupled device according to the first embodiment of the present invention.
Figure 14:
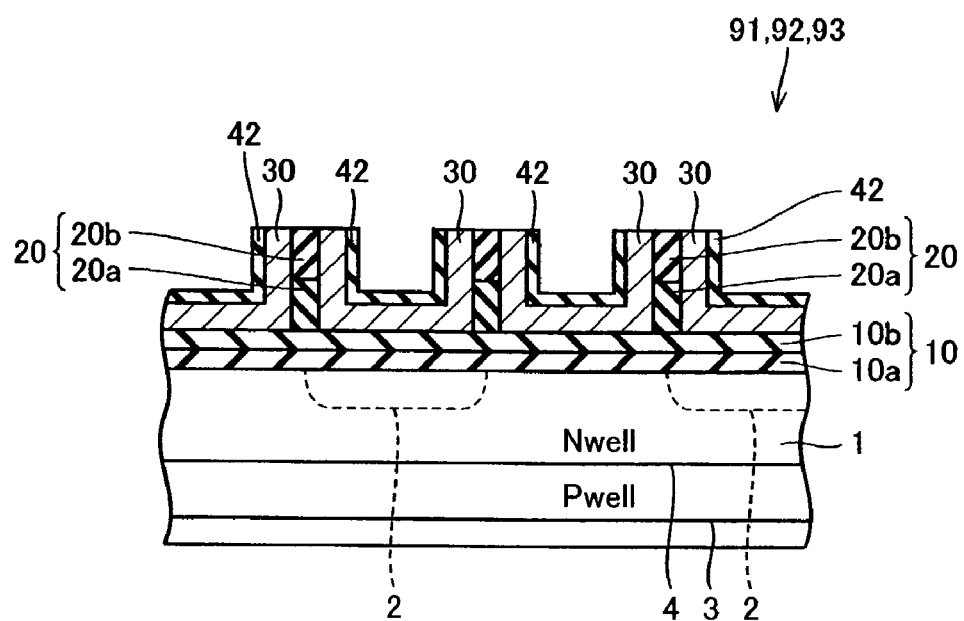

In the process common to the imaging part 91, the storage part 92 and the horizontal transfer part 93, the protective films 42 consisting of silicon oxide are formed with the thickness of about 5 nm to about 50 nm to cover the upper surface of the polysilicon film 30a, as shown in FIG. 13. Upper portions of the polysilicon film 30a are removed by polishing to expose at least the upper portions of the partitions 20. Thus, the concave gate electrodes 30 consisting of polysilicon films are formed between the adjacent partitions 20, as shown in FIG. 14. The protective films 42 are formed for excellently removing the upper portions of the polysilicon film 30a by CMP.

Thus, the charge-coupled device 90 having a single-layer gate electrode structure is formed according to the first embodiment. Thereafter the interlayer dielectric film (not shown) is formed on the overall surface and the contact holes (not shown) reaching the gate electrodes 30 are formed therein. The gate electrodes 30 are electrically connected to the upper wires (not shown) through the contact holes.

Figure 15:
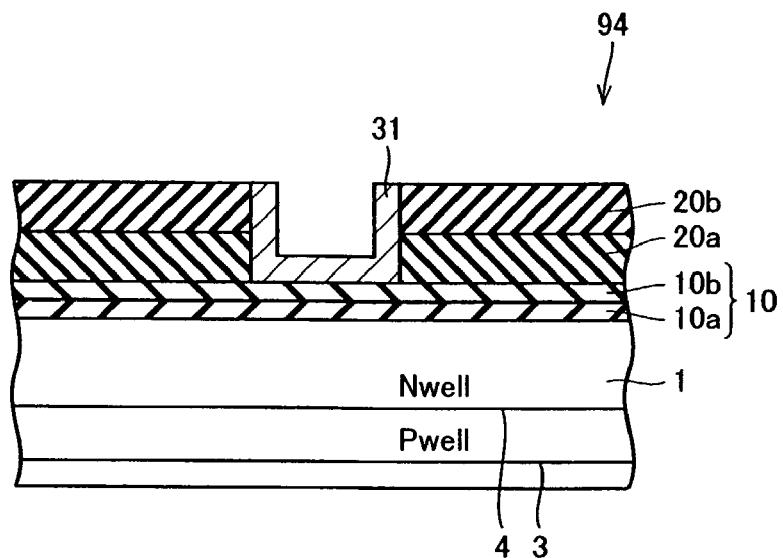
FIGS. 15 and 16 are sectional views for illustrating a fabrication process for the output part of the charge-coupled device according to the first embodiment of the present invention.
Figure 16:
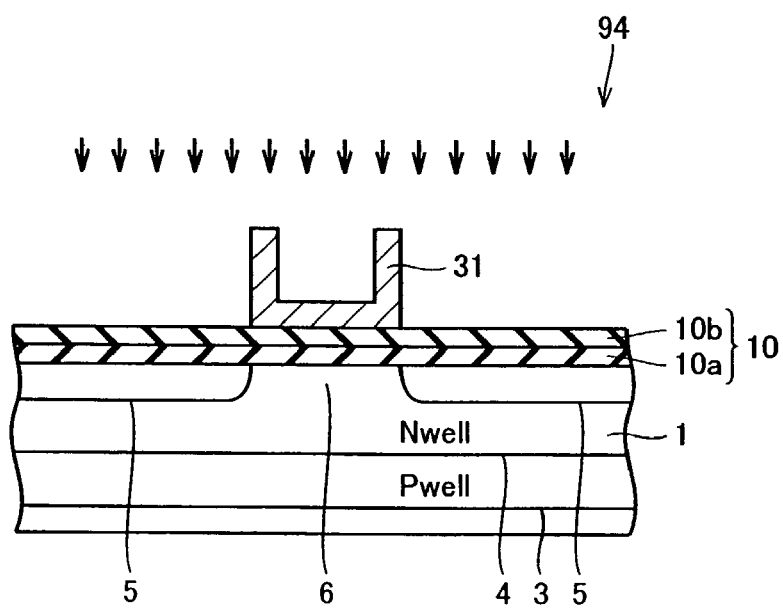

In parallel with the aforementioned fabrication process for the imaging part 91, the storage part 92 and the horizontal transfer part 93, a fabrication process for the output part 94 shown in FIGS. 15 and 16 is carried out. As shown in FIG. 15, the silicon oxide film 20a and the silicon nitride film 20b for defining the partitions 20 are formed on the gate insulator film 10 provided on the silicon substrate 1, and a portion for forming a control terminal (gate electrode or the like) of the driver element for the output part 94 is also removed by etching in the etching step for forming the partitions 20. The concave gate electrode 31 shown in FIG. 15 is formed through the steps of forming the gage electrodes 30 shown in FIGS. 13 and 14. Thereafter portions of the silicon oxide film 20a and the silicon nitride film 20b located on regions for defining the source/drain regions 5 are removed.

As shown in FIG. 16, boron (B) is ion-implanted under conditions of injection energy of about 10 keV to about 100 keV and an injection rate of about $1 \times 10^{14}/cm^{-2}$ to about $5 \times 10^{15}/cm^{-2}$ thereby forming the pair of P-type source/drain regions 5 to hold the channel region 6 therebetween. Alternatively, phosphorus (P) or arsenic (As) may be injected in place of boron (B) under the same conditions, thereby forming N-type source/drain regions 5. Thus formed is the driver element consisting of a P- or N-type MOS transistor consisting of the pair of P- or N-type source/drain regions 5, the gate insulator film 10 and the gate electrode 31.

(Second Embodiment)

Figure 17:
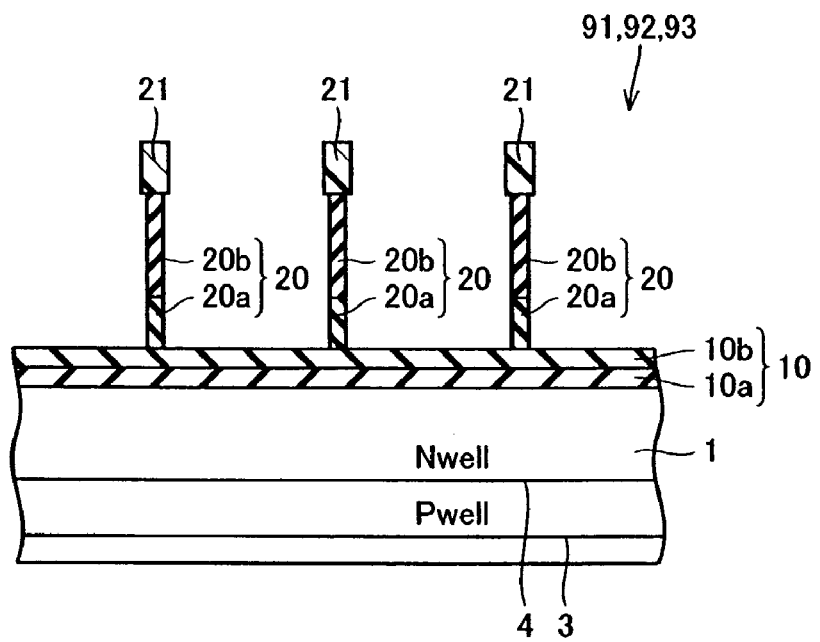
FIG. 17 is a sectional view for illustrating a partition forming process in a charge-coupled device according to a second embodiment of the present invention.

Referring to FIG. 17, a method of fabricating a charge-coupled device according to a second embodiment of the present invention employs isotropic etching in a process of forming partitions 20 similar to that shown in FIG. 9.

More specifically, resist films 21 formed with the width of the minimum critical dimension of lithography are employed as masks for performing isotropic dry etching thereby forming the partitions 20 smaller in width than the resist films 21, as shown in FIG. 17. Conditions for this isotropic dry etching are as follows:

Frequency: about 13.56 MHz

Power: about 300 W to about 700 W (about 500 W)

$CF_4$ Flow Rate: about $3 \times 10^{-4} m^3$/min. to about $7 \times 10^{-4} m^3$/min. (about $5 \times 10^{-4} m^3$/min. in the second embodiment)

$O_2$ Flow Rate: about $5 \times 10^{-5} m^3$/min. to about $15 \times 10^{-5} m^3$/min. (about $1 \times 10^{-4} m^3$/min. in the second embodiment)

Pressure: about 133 Pa to about 200 Pa (about 166 Pa in the second embodiment)

Substrate Temperature: about 50° C. to about 100° C. (about 75° C. in the second embodiment)

It is assumed that the gas flow rates are values in a standard state.

The width of the partitions 20 can be reduced below the minimum critical dimension of lithography by performing isotropic dry etching under the aforementioned conditions. When an ArF excimer laser having the minimum line width of 0.13 µm is employed for forming the resist films 21 with the minimum line width, for example, the width of the partitions 20 can be reduced to about 0.05 µm. Thus, the interval between adjacent gate electrodes 30 can be set to about 0.05 µm smaller than the limit of lithography, whereby the interval between the gate electrodes 30 can be remarkably reduced also when the gate electrodes 30 consist of single layers. Also when employing the gate electrodes 30 consisting of single layers, therefore, the charge-coupled device can be improved in performance such as sensitivity or saturation power, whereby the charge-coupled device can be easily fabricated to be capable of attaining excellent performance with the single-layer gate electrodes 30.

According to the second embodiment, a silicon oxide film 20a defines lower layers of layers forming the partitions 20 while a silicon nitride film 10b defines an upper layer of a gate insulator film 10, whereby an etching selection ratio with respect to the lower gate insulator film 10 can be ensured when removing portions of the silicon oxide film 20a and a silicon nitride film 20b from regions for defining source/drain regions. Thus, the portions of the silicon oxide film 20a and the silicon nitride film 20b for defining the source/drain regions can be easily removed.

(Third Embodiment)

In a method of fabricating a charge-coupled device according to a third embodiment of the present invention, impurity regions are formed in lower regions between adjacent gate electrodes 30 of an imaging part 91 and a storage part 92, dissimilarly to the aforementioned first embodiment.

Figure 18:
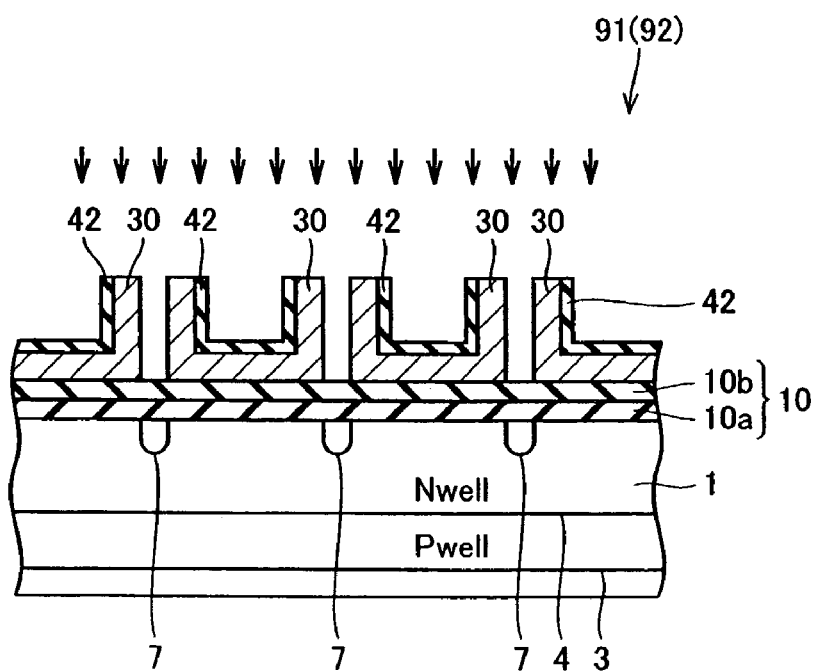
FIGS. 18 and 19 are sectional views for illustrating a fabrication process for an imaging part and a storage part of a charge-coupled device according to a third embodiment of the present invention.
Figure 19:
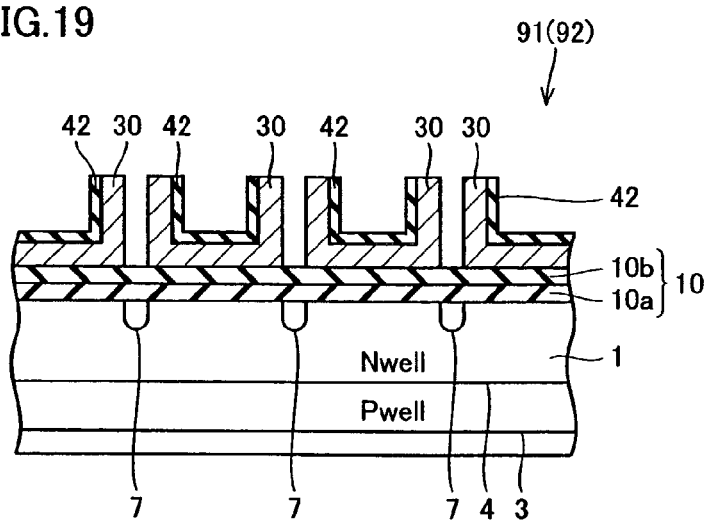

More specifically, gate electrodes 30 are formed through a fabrication process similar to that of the first embodiment shown in FIG. 14, and thereafter partitions 20 located between the gate electrodes 30 of the imaging part 91 and the storage part 92 are removed in the third embodiment, as shown in FIG. 18. The gate electrodes 30 are employed as masks for ion-implanting boron (B) under conditions of injection energy of about 5 keV to about 50 keV and an injection rate of about $1 \times 10^{10}/cm^{-2}$ to about $1 \times 10^{13}/cm^{-2}$ thereby forming impurity regions 7 in surface portions of a silicon substrate 1 under regions located between the adjacent gate electrodes 30. The impurity regions 7 are examples of the "second impurity region" in the present invention. Thus, a structure according to the third embodiment is obtained as shown in FIG. 19.

According to the third embodiment, the impurity regions 7 are formed on the surface portions of the silicon substrate 1 located under the regions between the gate electrodes 30 in the imaging part 91 and the storage part 92 as hereinabove described, whereby change of potentials between the regions located under the adjacent gate electrodes 30 can be smoothed in application of voltages. Thus, the charge-coupled device can improve charge transfer performance in the imaging part 91 and the storage part 92.

According to the third embodiment, further, silicon oxide films 20a define lower layers of the partitions 20 while a silicon nitride film 10b defines an upper layer of a gate insulator film 10, whereby the etching selection ratio between the partitions 20 and the gate insulator film 10 can be ensured in etching for removing the partitions 20. Thus, the partitions 20 can be easily removed.

Although the present invention has been described and illustrated in detail, it is clearly understood that the same is by way of illustration and example only and is not to be taken by way of limitation, the spirit and scope of the present invention being limited only by the terms of the appended claims.

For example, while portions of the silicon oxide film 20a and the silicon nitride film 20b are removed when forming the source/drain regions 5 of the MOS transistor serving as the driver element for the output part 94 in the aforementioned first embodiment as shown in FIGS. 15 and 16, the present invention is not restricted to this but the impurity can alternatively be ion-implanted while forming a resist film on the gate electrode 31 without removing the portions of the silicon oxide film 20a and the silicon nitride film 20b if the total thickness of the silicon oxide film 20a and the silicon nitride film 20b is about 10 nm to about 100 nm.

While the side portions of the polysilicon film 30a for defining the gate electrodes 30 are employed as masks for performing ion implantation in a self-aligned manner in the aforementioned first embodiment in the step shown in FIG. 11, the present invention is not restricted to this but ion implantation may alternatively be performed through the masks of the side portions of the gate electrodes 30 after forming the concave gate electrodes 30 shown in FIG. 14.

While the CCD image sensor 90 drives the imaging part 91 and the storage part 92 by applying the three-phase voltages φP1 to φP3 and φC1 to φC3 in the aforementioned first embodiment, the present invention is not restricted to this but the CCD image sensor 90 may alternatively drive the imaging part 91 and the storage part 92 with two-phase voltages similarly to the horizontal transfer part 93. In this case, high concentration impurity regions 2 may be alternately provided under the gate electrodes 30 also as to the imaging part 91 and the storage part 92.

While the silicon oxide film 10a and the silicon nitride film 10b form the gate insulator film 10 and the silicon oxide films 20a and the silicon nitride films 20b form the partitions 20 in each of the aforementioned embodiments, the present invention is not restricted to this but the gate insulator film 10 may alternatively be formed by only a silicon oxide film and the partitions 20 may alternatively be formed by only silicon nitride films. The etching selection ratio can be ensured on the interfaces between the partitions 20 and the gate insulator film 10 also in this case, whereby the partitions 20 can be easily formed by etching.

While the protective films 42 of silicon oxide are formed in the aforementioned first embodiment for excellently polishing the polysilicon film 30a by CMP, the present invention is not restricted to this but the polysilicon film 30a may be polished by CMP without forming the protective films 42.

While the present invention is applied to the frame transfer CCD image sensor 90 in the aforementioned first embodiment, the present invention is not restricted to this but is also applicable to an interline CCD image sensor, for example. Further, the present invention is also applicable to a charge-coupled device other than a CCD image sensor.

While the partitions 20 are formed by only either anisotropic etching or isotropic dry etching in each of the aforementioned embodiments, the present invention is not restricted to this but the partitions 20 may alternatively be formed by performing isotropic dry etching after anisotropic etching. Further alternatively, the partitions 20 may be formed by performing isotropic wet etching with hydrofluoric acid or the like after anisotropic etching.

Figure 20:
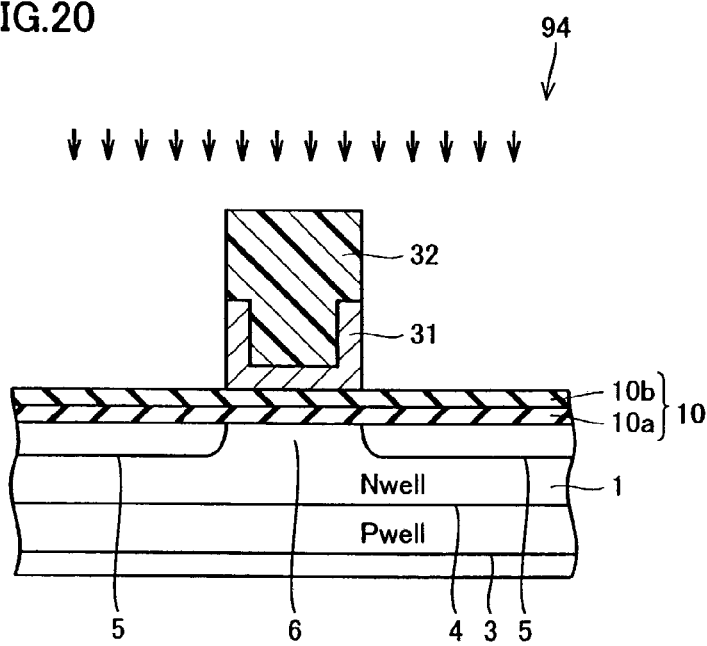
FIG. 20 is a sectional view for illustrating a fabrication process for an output part of a charge-coupled device according to a modification of the first embodiment of the present invention.
Figure 21:
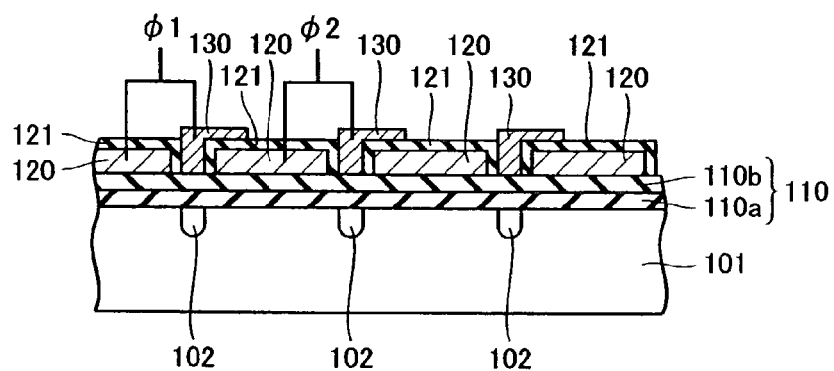
FIG. 21 is a sectional view showing the structure of a conventional charge-coupled device having a two-layer gate electrode structure.
Figure 22:
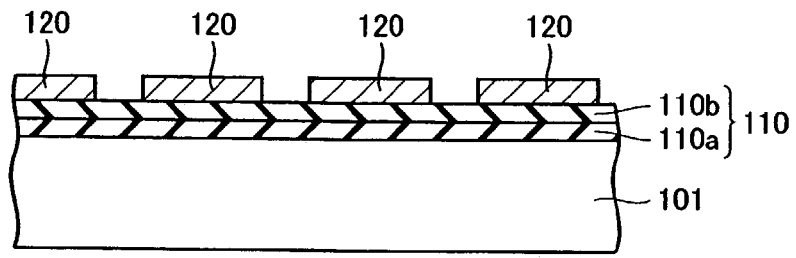
FIGS. 22 to 24 are sectional views for illustrating a fabrication process for the conventional charge-coupled device having a two-layer gate electrode structure shown in FIG. 21.
Figure 23:
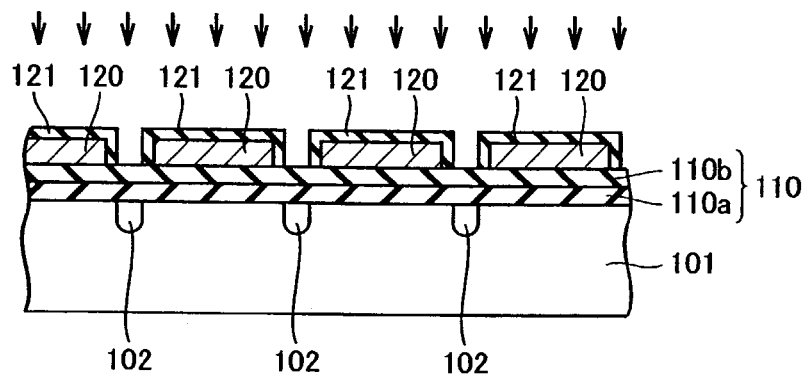
Figure 24:
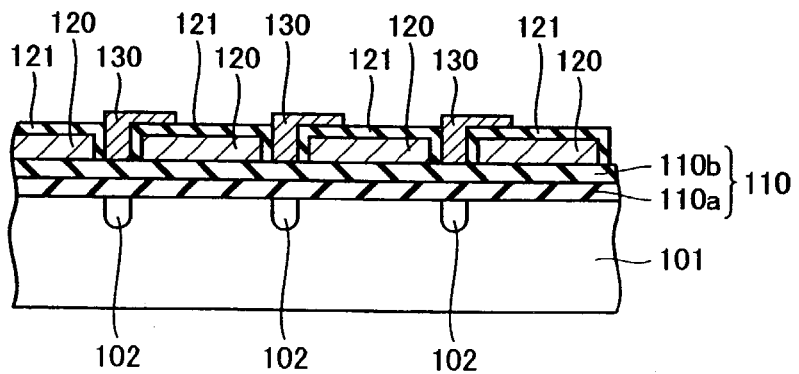

While the gate electrode 31 is employed as a mask for ion-implanting boron (B) thereby forming the pair of P-type source/drain regions 5 in the fabrication process for the output part 94 of the charge-coupled device 90 in the aforementioned first embodiment, the present invention is not restricted to this but a pair of P-type source/drain regions 5 may alternatively formed by forming a resist film 32 on a gate electrode 31 and thereafter ion-implanting boron (B) through a mask of the resist film 32, as in a modification of the first embodiment shown in FIG. 20. Thus, the gate electrode 31 can be inhibited from injection of the impurity (boron).

What is claimed is:

1. A charge-coupled device having a single-layer gate electrode structure, comprising:
    a gate insulator film formed on a semiconductor substrate;
    a plurality of partitions consisting of an insulator formed on said gate insulator film; and
    a concave gate electrode, arranged between adjacent said partitions, having side surfaces formed along side portions of said partitions, wherein
    said partitions include:
    a first partition, and
    a second partition, formed on said first partition, consisting of a different material from said first partition.

2. The charge-coupled device according to claim 1, wherein
    said gate insulator film includes:
    a first gate insulator film, and
    a second gate insulator film, formed on said first gate insulator film, consisting of a different material from said first gate insulator film.

3. The charge-coupled device according to claim 1, wherein
    said partitions are formed by etching through a mask of a resist film to have a width not more than the width of said resist film.

4. The charge-coupled device according to claim 1, wherein
    portions of said gate insulator film located on the interfaces between said gate insulator film and said partitions and portions of said partitions located on the interfaces between said gate insulator film and said partitions are made of materials having different etching selection ratios.

5. The charge-coupled device according to claim 1, wherein
    one of said partitions separates two adjacent said concave gate electrodes, and
    said charge-coupled device further comprising a first impurity region formed on a surface portion of said semiconductor substrate located under one of said adjacent gate electrodes.

* * * * *